United States Patent [19]
Sado

[11] 4,288,081
[45] Sep. 8, 1981

[54] GASKETS FOR ELECTRIC SHIELDING

[75] Inventor: Ryoichi Sado, Saitama, Japan

[73] Assignee: Shin-Etsu Polymer Company, Ltd., Tokyo, Japan

[21] Appl. No.: 141,482

[22] Filed: Apr. 18, 1980

[30] Foreign Application Priority Data

Apr. 28, 1979 [JP] Japan .................................. 54-52915

[51] Int. Cl.³ .......................... H05K 9/00; H01B 1/06; F16J 15/14
[52] U.S. Cl. ................................. 277/1; 277/DIG. 6; 277/237 R; 174/35 GC; 264/108; 264/158; 252/512; 29/592 R
[58] Field of Search ................... 277/1, 227, 233, 234, 277/235 R, 235 A, 235 B, 236, 12, DIG. 6, 96.2, 138, 165, 237, 229, 230, 80; 174/35 GC; 264/108, 118, 158; 29/592 R, 608; 252/502, 512

[56] References Cited

U.S. PATENT DOCUMENTS

| 2,849,312 | 8/1958 | Peterman | 264/108 X |
| 3,140,342 | 7/1964 | Ehrreich et al. | 174/35 GC |
| 3,141,050 | 7/1964 | Blume | 264/108 X |
| 3,238,355 | 3/1966 | Van Eeck | 252/512 X |
| 3,359,350 | 12/1967 | Godfrey | 264/108 X |
| 3,514,326 | 5/1970 | Stow | 252/512 X |
| 3,673,121 | 6/1972 | Meyer | 252/512 X |
| 3,752,899 | 8/1973 | Bakker | 174/35 GC |
| 4,102,831 | 7/1978 | Osgood | 264/108 X |

FOREIGN PATENT DOCUMENTS 2827676  1/1979  Fed. Rep. of Germany . 174/35 GC

Primary Examiner—Robert S. Ward, Jr.
Attorney, Agent, or Firm—Hopgood, Calimafde, Kalil, Blaustein & Judlowe

[57]                ABSTRACT

The invention provides a novel gasket for electric shielding composed of an electrically insulating rubbery elastic material as the continuum or matrix and a conductive phase dispersed therein. Different from conventional gaskets for electric shielding in which conductive filaments or particles form the dispersed phase, the inventive gasket for electric shielding comprises flakes of a conductive material as the dispersed phase in the matrix and the flakes are in orientation in such a manner that the flat surfaces of them lie substantially perpendicularly to the contacting surfaces of the gasket. Owing to this unique internal structure, the inventive gasket for electric shielding is very efficient in absorbing the energy of the electric fields or electromagnetic waves.

2 Claims, 6 Drawing Figures

GASKETS FOR ELECTRIC SHIELDING

BACKGROUND OF THE INVENTION

The present invention relates to a gasket for electric shielding having a novel internal structure or, more particularly, to a gasket composed of a matrix of an electrically insulating rubbery elastic material and an electrically conductive phase dispersed in the matrix.

When a gasket is desired to have an electrostatic or electromagnetic shielding effect, it is conventional in the prior art that the gasket is formed of a matrix or a continuum phase made of an electrically insulating rubbery elastic material and an electrically conductive phase dispersed in the matrix. Such a conductive dispersed phase is usually given by the orientation of fine filaments of a metal or carbon aligned as embedded in the matrix in a direction approximately perpendicular to the contacting surfaces of the gasket, i.e. in a direction substantially parallel with the direction of compression of the gasket when it is in use (see, for example, U.S. Pat. No. 2,885,459, No. 3,126,440, No. 3,542,939 and No. 3,708,871). Alternatively, such perpendicular conductive paths are provided by a unidirectionally arranged dispersion of electrically conductive rubber portions in the matrix (see, for example, U.S. Pat. No. 3,140,342). Further alternatively, a gasket for electric shielding is obtained by merely shaping and electrically conductive rubber prepared by incorporating a large amount of electrically conductive particles, e.g. metal powders, into a rubbery elastomer (see, for example, U.S. Pat. No. 3,609,104).

These prior art gaskets for electric shielding, however, have their respective disadvantages. In the first type of conductive filament dispersion, for example, the filament density within the surface of the gasket must be sufficiently high in order to ensure good electric conductivity so that the elastic resilience on the gasket surfaces is badly influenced and the gas-tightness for sealing is reduced when the gasket is put to use even though the electric shielding effect may be complete. In addition, the diameter and length of the filament or wire material should be accorded with the frequency of the electromagnetic waves in order to obtain optimum shielding effect. As a consequence, there may sometimes be caused surface leak current or surface discharge resulting in further deterioration or degradation of the surfaces of the gasket. Accordingly, a gasket of this type should be contacted with the sealed surfaces with an excessively large compressive force to avoid the above described drawbacks.

Gaskets of the second type, i.e. conductive paths formed with electroconductive rubbery material, are unavoidably expensive due to the complicated process for preparing them and, in addition, also require a compressive force large enough to ensure gas tightness in the contacting surfaces with the sealed surfaces.

Finally, the gaskets of the type of metal powder dispersion must be loaded with so large an amount of the metal powder to obtain good electric conductivity that the moldability as well as the mechanical properties of the gaskets are sometimes very unsatisfactory with much decreased flexibility and elasticity. Furthermore, the metal particles come off the gasket surface when rubbed or excessively compressed resulting in generation of sparks and roughened surface condition which necessitates a further increased compressive force to ensure gas thickness.

The material of the metal powder currently in use is almost exclusively limited to silver owing to the availability of very fine powders and some other reasons. Silver powders are, however, defective due to the migration of the metal particles in the presence of moisture and corrosiveness against the other metal parts if not to mention the outstanding expensiveness of silver.

SUMMARY OF THE INVENTION

It is therefore an object of the present invention to provide a novel and improved gasket for electric shielding free from the above described problems in the prior art gaskets for electric shielding comprising a member composed of an electrically insulating rubbery elastic material as the matrix or the continuum phase and an electrically conductive phase dispersed in the matrix.

Thus, the gasket for electric shielding according to the invention comprises a member composed of a matrix made of an electrically insulating rubbery elastic material and flakes of an electrically conductive material dispersed in the matrix in such a manner that the flat surfaces of the flakes are substantially not in parallel with the contacting surfaces of the gasket.

The above described gasket for electric shielding is prepared, according to the invention, by the method comprising the steps of (a) admixing flakes of an electrically conductive material into an electrically insulating rubbery elastic material in a plastic condition to give a dispersion of the flakes in the rubbery elastic material as the matrix, (b) subjecting the thus obtained dispersion to shearing deformation in one direction so as that the flakes are oriented in the matrix to have the flat surfaces thereof substantially in parallel with the direction of the deformation, (c) hardening the rubbery elastic material to fix the flakes as dispersed and oriented in the matrix, and (d) slicing the dispersion with the hardened rubbery elastic material in a plane substantially not in parallel with the direction of the deformation.

DETAILED DESCRIPTION OF THE PREFERRED EMBODIMENTS

Figure 1:
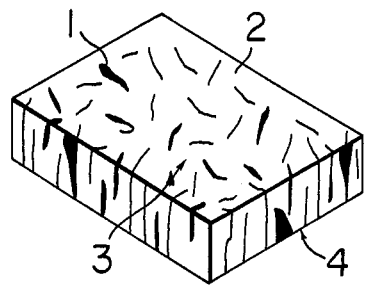
FIG. 1 is a perspective view of an inventive gasket for electric shielding in a rectangular sheet form and FIG. 2 is a perspective view of a rectangular ring-formed gasket obtained by cutting the gasket in FIG. 1.

The matrix or the continuum phase of the inventive gasket for electric shielding is made of a rubbery elastic material which is exemplified by various kinds of synthetic rubbers such as silicone rubber, butyl rubber, ethylene-propylene copolymer rubber, polyurethane rubber, isoprene rubber and the like as well as foamed or cellular bodies of these rubbers. Further, several kinds of relatively soft thermoplastic resins may be used such as polyethylene, polyester, copolymers of ethylene and vinyl acetate, polyurethane, polyamide, polyvinyl chloride, polyvinylidene chloride, copolymers of acrylonitrile and butadiene and the like, if necessary, with formulation of a plasticizer.

The electrically conductive phase to be dispersed in the above matrix is preferably made of a metal though not limited thereto. Suitable metals for the purpose are exemplified by tin, lead, bismuth, aluminum, copper and iron as well as those alloys containing these metals. Desirably, they have good ductility and malleability so that any thin foils of them are readily available. A particularly preferred metallic material is tin. This is because tin has an adequate ductility and low hardness so that foils of tin have good compatibility with the matrix material in blending as well as in the finished gasket. Further, the oxide film formed on the surface of tin metal is limited to the very superficial layer exhibiting sufficient stability against oxidation and the film of tin oxide has an adequate electroconductivity. The thickness of the flakes formed from such a metal foil is preferably as thin as possible or 100 µm or smaller or, preferably, 50 µm or smaller in order that the resultant composite may have good mechanical properties. For example, the hardness of the gasket as a whole is desirably from 30 to 55 by the JIS scale. Alternatively, mica flakes and tiny fragments of thin plastic films plated with a metal by vacuum evaporation or other methods can be used. It is optional that the metal surfaces are protected against oxidation or corrosion by providing plating with a metal such as gold, silver, nickel or other stable metals.

The dimension of the flakes as dispersed in the matrix is not limitative but it should be large enough when compared with the thickness of the flakes in order that the beneficial effect of the oriented distribution of the flakes in the matrix is fully exhibited. Otherwise the composite dispersion resembles a mere dispersion of a metal powder in a rubbery matrix. In this connection, the dimension of the flakes in the matrix is preferably in the range from 0.5 to 10 mm in diameter depending on the size of the gasket.

The shape of the individual flakes is not critical and rather uncontrollable since a metal foil incorporated into the rubbery matrix is broken finer and finer as the blending is continued most likely to give irregular fragments of the foil dispersed in the matrix. Thus, the dimension of the flakes is examined by periodical sampling of the composite under blending until desired fineness of the flakes has been reached.

In carrying out blending of the flakes of the conductive material and the rubbery elastic material as the matrix in a plastic condition, it is optional, if necessary, that a small amount of an organic solvent is admixed to reduce the consistency of the matrix material so as that an excessive shearing force to the flakes can be avoided preventing formation of unduly fine flakes. Blending of the matrix material and the flakes is performed with any conventional blending machines used in the art such as mixing rollers, internal mixers, kneaders and the like. It is of course optional that the rubbery elastic material as the matrix is admixed with conventional rubber additives such as a vulcanizing agent or curing agent, reinforcing filler, plasticizer, foaming agent, coupling agent to improve adhesion with the flakes, flame retarder, coloring agent and the like. It is sometimes recommendable that the metal flakes are subjected to surface treatment with a primer or a coupling agent prior to admixing with the matrix material to improve adhesion.

The amount of the metal flakes to be blended with the matrix material is determined with consideration of the balance of the desired shielding effect and the mechanical properties of the gasket. It is usually in the range from 3 to 30% by volume or, preferably, from 3 to 20% by volume of the finished gasket. Too high loading amounts of the metal flakes are naturally undesirable due to the poor mechanical properties of the gasket while a loading amount less than 3% by volume is unsatisfactory due to the inferior shielding effect.

The thus plasticized matrix material with admixture of the flakes is then subjected to shearing deformation with an object to orient the flakes within the matrix. This effect is obtained by giving a unidirectional stress to the composite dispersion, for example, by use of a screw pump, gear pump, plunger pump and the like. Similar unidirectional plastic deformation is effected also by use of a conventional rubber or plastic processing machine such as an extruder machine, injection machine, calendering roller and the like. The orientation of the flakes within the matrix proceeds as the composite dispersion flows in a narrow pathway under pressure to exit out of a die of, for example, the extruder machine. It is advantageous that a straightener means is provided in the pathway to accelerate the orientation of the flakes along the direction of flow.

In any way, the distance between adjacent flakes is of some importance to obtain good shielding effect. This distance should of course be determined with consideration of the balance between the desired shielding effect and the mechanical properties of the gasket. In general, the distance is desirably 1 mm or smaller in an average from the standpoint of the shilding effect and, in particular, in the range from 0.5 to 1.0 mm to be smaller than a half of the wavelength of the electromagnetic waves in the so-called EHF region.

The thus extruded composite dispersion containing the oriented flakes is then subjected to the step of hardening of the matrix material to fix the orientation of the flakes within the matrix. When the matrix material is a thermoplastic resin, hardening of the matrix is performed by merely cooling down the composite dispersion to room temperature. When the matrix material is a rubbery polymer, hardening of the matrix necessitates curing of the polymer. The thus obtained composite dispersion is usually in a form of a rod, belt, tube or the like of continuous length having an internal structure of flakes with their flat surfaces lying in the axial direction. When a composite dispersion of larger cross section is desired, a plurality of such belts, rods, tubes or the like are integrally bonded together into a block by compression in alignment either before or after hardening of the matrix.

The composite dispersion thus obtained having an oriented internal structure of the flakes is then sliced in a plane not in parallel with or, preferably, substantially perpendicular to the axial direction along which the flat surfaces of the flakes lie. The sheet obtained by slicing, which is used as a gasket as such, has an internal structure of the flakes with their flat surfaces lying perpendicularly to the surfaces of the sheet.

The composite dispersion with the metal flakes dispersed in the matrix of the rubbery elastomeric material is liable to punch cutting. For example, a large square ring can be obtained from a sheet of the composite by cutting out with a punch.

The inventive gaskets for electric shielding are further illustrated with reference to the drawing.

FIG. 1 shows a perspective view of the inventive gasket in a form of a sheet having the top surface 3 and the bottom surface 4 with an internal structure composed of the matrix 2 made of an electrically insulating rubbery elastic material and the electroconductive flakes 1 embedded and dispersed within the matrix 2. The flakes 1 are so oriented that their flat surfaces lie in the direction substantially perpendicular to the top and bottom surfaces 3, 4 of the sheet. Accordingly, the cross sections of the flakes 1 appear in the top and bottom contacting surfaces 3 and 4 of the sheet in lines. The flakes 1 themselves may not be in parallel with each other. Further, each of the flakes 1 not necessarily penetrates the whole thickness of the sheet to expose its cross section on both of the contacting surfaces 3 and 4. It should be noted that the unidirectional orientation of the flakes has only a statistical significance so that misorientation or curving of a small number of the flakes may have no detrimental effects on the performance of the gasket as a whole.

Figure 2:
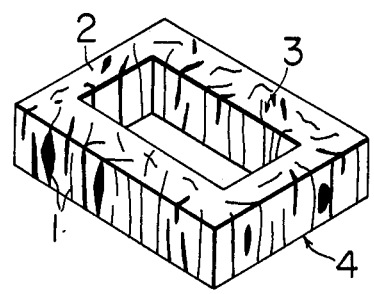

FIG. 2 is a perspective view of a gasket of a rectangular ring form. Such a ring gasket is readily obtained by removing the center portion of the gasket shown in FIG. 1.

Figure 3:
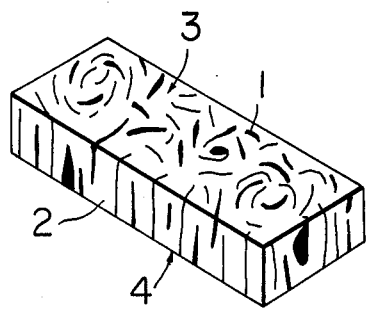
FIG. 3 is a perspective view of an inventive gasket showing vortex-like distribution of the flakes appearing in the top and bottom surfaces.

FIG. 3 is a perspective view of a gasket of the invention which is obtained by just slicing an extrudate from a rectangular die. As is shown in the top surface 3, the conductive flakes 1 in both of the end portions are arranged vortex-like owing to the different flowing of the composite dispersion in these portions from the center portion.

Figure 4:
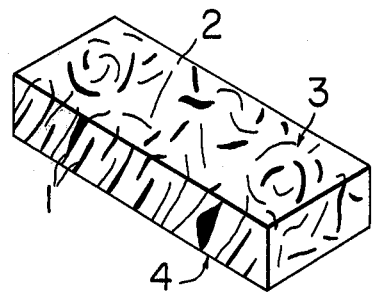
FIG. 4 is a perspective view of an inventive gasket in which the orientation of the conductive flakes is not in the perpendicular direction to the contacting surfaces of the gasket but at an angle of about 60°.

FIG. 4 is a perspective view of a gasket similar to FIG. 3 but, in this case, the slicing plane of the extrudate from the rectangular die is not perpendicular to the direction of extrusion but making an angle of about 60° with the direction of extrusion.

Figure 5:
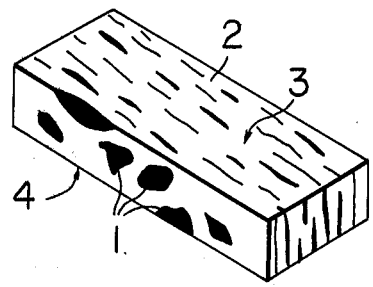
FIG. 5 is a perspective view of an inventive gasket in which the flat surfaces of the conductive flakes are all in parallel with each other substantially.

FIG. 5 is a perspective view of a gasket prepared by slicing a belt or slab obtained by calendering in a plane perpendicular to the direction of rolling out from the calendering machine. In this case, the flat surfaces of all of the flakes are substantially parallel with each other so that the cross sections of the flakes appearing in the top surface 3 and bottom surface 4 are not in random distribution but run in streaks.

Figure 6:
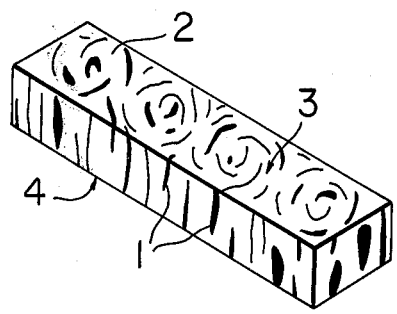
FIG. 6 is a perspective view of an inventive gasket in which the conductive flakes are oriented forming four vortices as viewed on the top or bottom surface.

FIG. 6 is a perspective view of a gasket prepared by slicing a block obtained by integral bonding of four rod-like extrudates of the composite dispersion so that the cross sections of the flakes appearing in the top surface 3 and bottom surface 4 are arranged in four vortices indicating that the flakes in each of the rod-like extrudates have been oriented in coaxial distribution.

The above described gaskets for electric shielding according to the invention are used just in the same manner as the conventional gaskets for electric shielding in various kinds of electric and electronic instruments where shielding of electric fields or electromagnetic waves is desired. The efficiency of energy absorption in electric shielding is much higher with the inventive gasket than with conventional gaskets since the dielectric path length is very much increased by the multiple reflection repeated between the flat surfaces of the conductive flakes oriented in the matrix.

The gaskets of the present invention further provide a possibility of enhancing the shielding efficiency by suitably positioning the gasket with respect to the relative directions of the orientation of the metal flakes and the propagation of the electromagnetic waves against which the shielding effect is expected. The means for obtaining optimum positioning of the gasket is conventional, for example, by use of a suitable supporting member.

Following is an example to illustrate the inventive gasket in further detail.

EXAMPLE

A composite sheet of 5 mm thickness was prepared by uniformly blending in a mixing roller 100 parts by volume of a silicone rubber compound (KE 171U, a product by Shin-Etsu Chemical Co.) with 1.5% by weight of a curing agent (C-2, a product by the same company) and 30 parts by volume or 4 parts by volume of ribbons of tin metal having a width of 7 mm and a thickness of 40 μm.

Small pieces of these sheets were dissolved in toluene to find that the tin ribbons had been disintegrated into small flakes ranging from 7 mm×10 mm to 1 mm×1.5 mm.

The composite sheets with oriented tin flakes were subjected to curing of the silicone rubber and then sliced in planes perpendicular to the plane of the flakes with 2 mm intervals to give a strip-like gasket material of 5 mm width and 2 mm thickness. These gasket materials were used for the shielding of video cameras to find that the shielding effect was very satisfactory.

In the next place, a plurality of the composite sheets were stacked on each other with use of an adhesive agent into a block and the thus obtained block was sliced in planes perpendicular to the surface of the tin flakes to give sliced sheets of 2 mm or 5 mm thickness. Discs of 50 mm diameter were obtained by punch cutting from these sheets and the shielding power of the discs was examined in the direction of thickness. The results were as given in Table 1 below.

When the amount of then tin flakes was decreased to 1.5 parts by volume, the other conditions being the same, the shielding power was 13 dB with a disc of 2 mm thickness at a frequency of 2.45 GHz. On the other hand, the gasket material prepared in the same manner as above but with formulation of 50 parts by weight of the tin flakes had an undesirably high hardness to be used as a gasket.

Further, the stratified blocks formed with the composite sheets above were sliced in planes forming an angle of 45° with the plane of the metal flakes to give sheets of 2 mm thickness. The shielding power of the discs of 50 mm diameter cut out from the sheets by punching was as set out in Table 2 below.

TABLE 1

| Thickness, mm | Frequency, GHz | Tin flakes, parts by volume | |
|---|---|---|---|
| | | 4 | 30 |
| 2 | 2.45 | 20 dB | 40 dB |
| | 9.00 | 18 dB | 38 dB |
| 5 | 2.45 | 35 dB | 52 dB |
| | 9.00 | 30 dB | 50 dB |

TABLE 2

| Thickness, mm | Frequency GHz | Tin flakes, parts by volume | |
| --- | --- | --- | --- |
| | | 4 | 30 |
| 3 | 2.45 | 23 dB | 52 dB |
| | 9.00 | 23 dB | 50 dB |

What is claimed is:

1. A gasket for electric shielding which comprises a flat member composed of a matrix made of an electrically insulating rubbery elastic material and flakes of an electrically conductive material dispersed in the matrix in such a manner that the flat surfaces of the flakes are substantially not in parallel with the contacting surfaces of the flat member.

2. A method for the preparation of a gasket for electric shielding which comprises the steps of (a) admixing flakes of an electrically conductive material into an electrically insulating rubbery elastic material in a plastic condition to form a composite dispersion of the flakes in the rubbery elastic material as the matrix, (b) subjecting the thus obtained composite dispersion to shearing deformation on one direction so as that the flakes are oriented in the matrix to have the flat surfaces thereof substantially in parallel with the direction of the deformation, (c) hardening the rubbery elastic material in a plastic condition to fix the flakes as dispersed and oriented in the matrix, and (d) slicing the composite dispersion with the thus hardened rubbery elastic material in a plane substantially not in parallel with the direction of the deformation.

* * * * *